United States Patent [19]

Steensma

[11] 4,381,461
[45] Apr. 26, 1983

[54] FREQUENCY SYNTHESIZER

[75] Inventor: Peter D. Steensma, Midland Park, N.J.

[73] Assignee: International Telephone and Telegraph Corporation, New York, N.Y.

[21] Appl. No.: 224,860

[22] Filed: Jan. 14, 1981

[51] Int. Cl.³ .................... H03B 19/00; H03B 21/02
[52] U.S. Cl. .................... 307/529; 328/14; 328/18
[58] Field of Search .................... 328/14, 18; 307/529

[56] References Cited

U.S. PATENT DOCUMENTS

| | | | |
|---|---|---|---|
| 3,568,069 | 3/1971 | Gabor | 328/14 |
| 3,597,699 | 8/1971 | Seipel | 307/529 |
| 4,056,692 | 11/1977 | Place | 328/14 |
| 4,100,498 | 7/1978 | Alsup et al. | 328/14 |

OTHER PUBLICATIONS

1978 Ultrasonics Symposium Proceedings, IEEE Cat. #78CHI344-ISU, pp. 553-556, "An Improved Frequency Hop Modem Based on Chirp Mixing", by Eustace et al.
1975 Ultrasonics Symposium Proceedings, IEEE Cat. 75CHO994-4SU, pp. 371-376, "Programmable Signal Processing by Analog Chirp-Transformation using Saw Devices", by Atzeni, Manes & Masotti.
Proceedings of the IEEE, May 1976, pp. 826-828, "Generation & Correlation of Digitally Controlled Frequency-Hopped Waveforms using Surface Acoustic Wave Devices", by Grant, Morgan & Collins.
1977 Ultrasonics Symposium Proceedings, IEEE Cat. 77CHI264-ISU, pp. 514-523, "Performance of Frequency Hop Synthesisers Based on Chirp Mixing", by Darby, Bale & Estace; Hannah & Patterson.

Primary Examiner—John S. Heyman
Attorney, Agent, or Firm—John T. O'Halloran; Alfred C. Hill

[57] ABSTRACT

The frequency synthesizer to generate a selected, adjustable discrete frequency output signal comprises a pair of acoustic means, a circuit to excite one of the pair of acoustic means with pulses having a given repetition frequency and to excite the other of the pair of acoustic means by the pulses after being delayed a given variable amount, and a frequency mixer coupled to each of the pair of acoustic menas to provide the selected discrete frequency output signal. Several embodiments of the acoustic means are disclosed.

23 Claims, 10 Drawing Figures

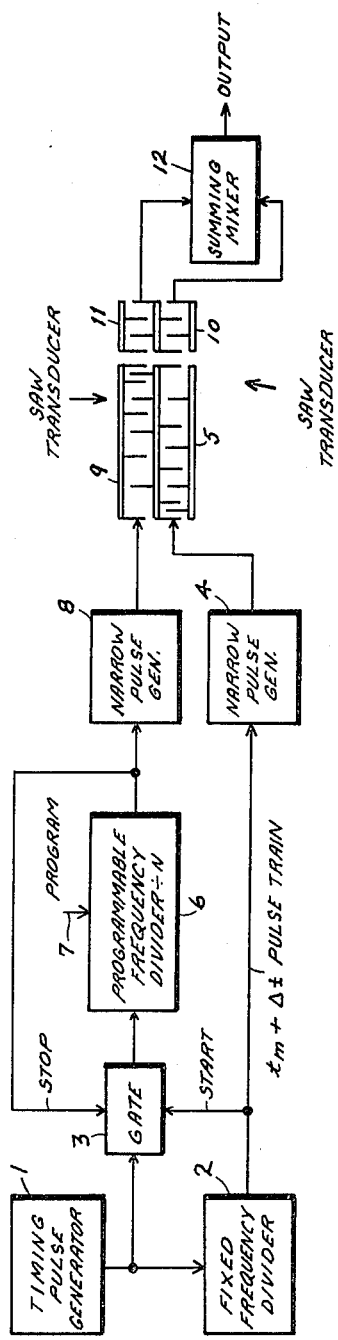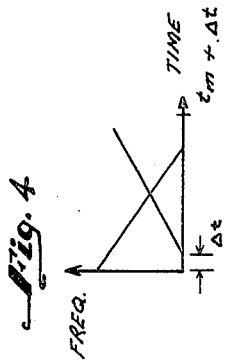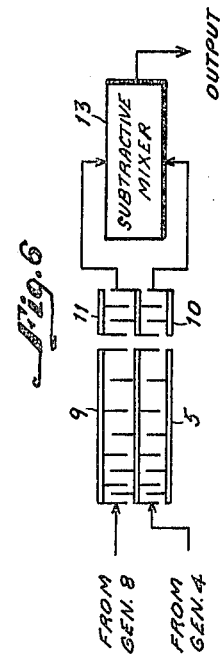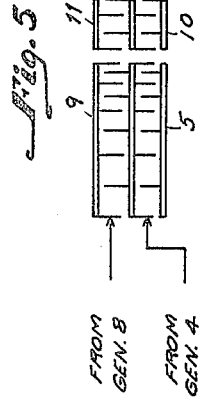

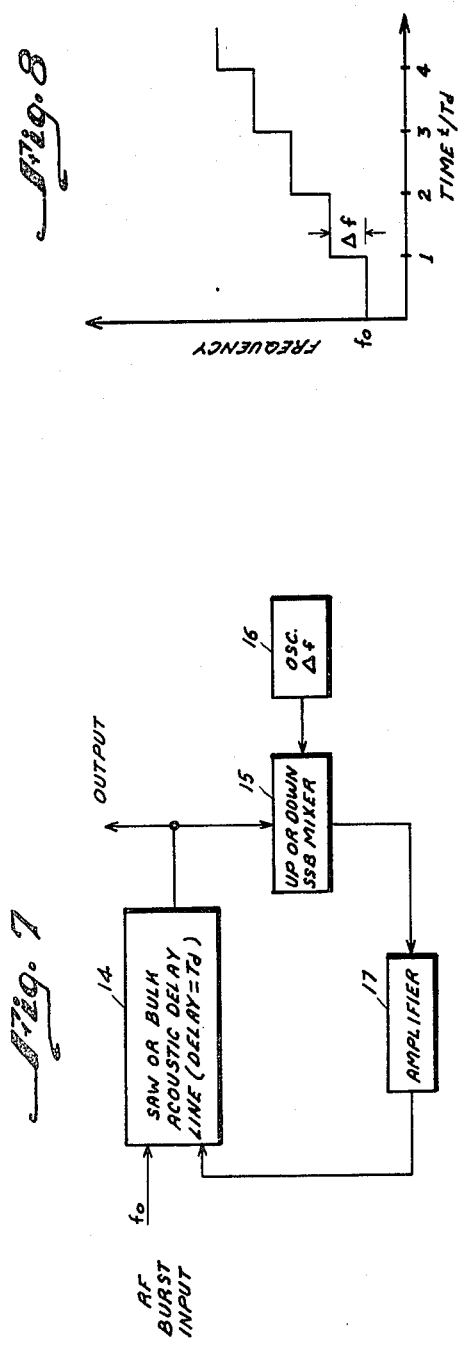
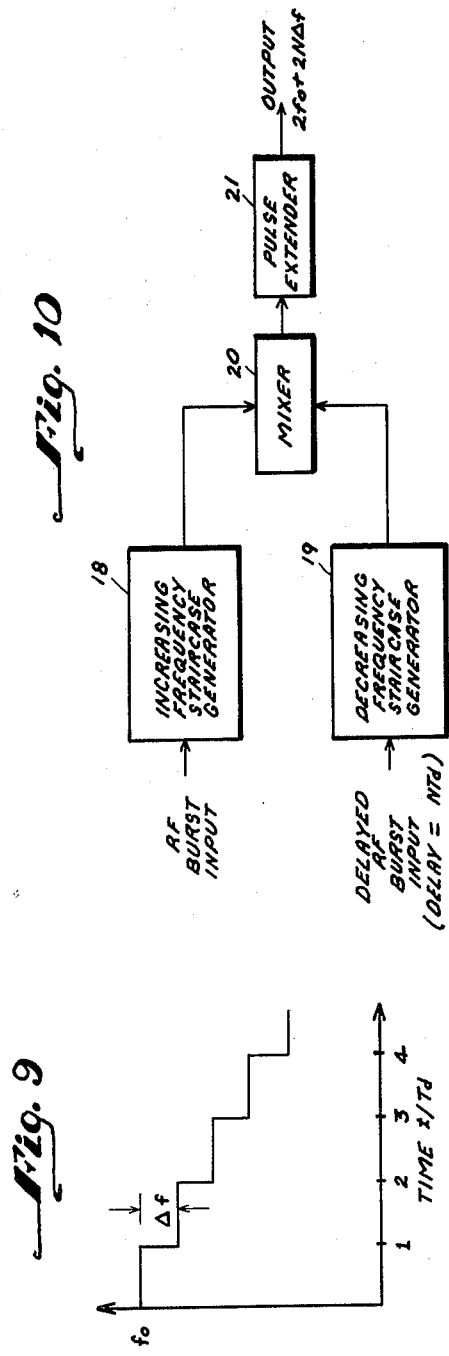

4,381,461

FREQUENCY SYNTHESIZER

BACKGROUND OF THE INVENTION

The present invention relates to frequency synthesizers and more particularly to a frequency synthesizer employing acoustic devices, such as surface acoustic wave (SAW) or bulk acoustic devices.

Conventional frequency synthesizers employ filtering techniques based on mixers and dividers, phase locked loops or narrow filters to separate a single frequency line (discrete frequency) from a comb of frequencies derived from a single high quality reference oscillator. In order to get the necessary rejection and narrow bandpass characteristics desired, either very high quality filters must be employed, many successive stages of mixing and frequency division must be employed, or expensive programmable dividers must be employed in the phase locked loops.

SUMMARY OF THE INVENTION

An object of the present invention is to provide a frequency synthesizer that will provide narrowly spaced single (discrete) frequency signals at high frequencies at the lowest cost possible.

Another object of the present invention is to provide a frequency synthesizer to generate narrowly spaced single (discrete) frequency signals at high frequencies that can be conveniently varied by simple digital control signals.

A further object of the present invention is to provide a frequency synthesizer employing SAW devices to generate narrowly spaced single (discrete) frequency signals at high frequencies that can be conveniently varied by simple digital control signals.

A feature of the present invention is the provision of a frequency synthesizer to generate a selected, adjustable discrete frequency output signal comprising: a pair of acoustic means each providing an output signal having a predetermined frequency versus time characteristic; first means coupled to each of the pair of acoustic means to excite one of the pair of acoustic means with pulses having a given repetition frequency and to excite the other of the pair of acoustic means by the pulses after being delayed a given variable amount; and second means coupled to each of the pair of acoustic means to provide the selected discrete frequency output signal.

BRIEF DESCRIPTION OF THE DRAWING

Above-mentioned and other features and objects of this invention will become more apparent by reference to the following description taken in conjunction with the accompanying drawing, in which:

FIG. 1 is a block diagram illustrating the frequency synthesizer in accordance with the principles of the present invention employing a first embodiment of the acoustic means;

FIGS. 2-4 are frequency-time graphs useful in illustrating the operation of the acoustic means of FIG. 1;

FIG. 5 illustrates a second embodiment of the acoustic means that can be employed in the synthesizer of FIG. 1;

FIG. 6 illustrates a third embodiment of the acoustic means that can be employed in the synthesizer of FIG. 1;

FIG. 7 is a block diagram of a fourth embodiment of an acoustic means that can be employed as each of the acoustic means of the synthesizer of FIG. 1;

FIGS. 8 and 9 are frequency time graphs useful in explaining the operation of the acoustic means of FIG. 7; and FIG. 10 is a block diagram illustrating how the acoustic means of FIG. 7 are combined to replace the acoustic means in the synthesizer of FIG. 1.

DESCRIPTION OF THE PREFERRED EMBODIMENTS

Referring to FIG. 1, the frequency synthesizer in accordance with the principles of the present invention is shown to comprise a timing pulse generator 1 generating a pulse train having a predetermined high repetition frequency. The output of generator 1 is coupled to a fixed frequency divider 2 and to a gate circuit 3. Divider 2 divides the output pulse train of generator 1 to a lower repetition rate pulse train having a repetition period $t_m + \Delta t$ which is coupled to a narrow pulse generator 4. The narrow pulse output of generator 4 excites a first acoustic means in the form of a SAW interdigital transducer 5 to cause RF (radio frequency) oscillation therein. Generator 4 is any circuit that will respond to an edge of a pulse to produce a very narrow pulse or spike output. Such a circuit could, for example, be a monostable circuit or an EXCLUSIVE OR circuit having the input signal applied thereto directly and through a short delay line. The output of divider 2 is also applied to gate circuit 3 such that when a pulse appears at the output of divider 2, the gate circuit 3 is open with the output therefrom being coupled to the programmable frequency divider 6 whose division factor can be adjusted by very simple digital control signals applied as a program to input 7 of divider 6. The divider 6 produces a pulse output after N input pulses pass through gate circuit 3 from generator 1. It is the function of divider 6 to effectively provide a delay for the pulse train that is supplied by the output of divider 2 with this delay being variable by varying the value of N through the program applied to input 7. The output pulse from divider 6 is used to close the gate circuit 3 and is also coupled to a narrow pulse generator 8 having the same purpose as generator 4 with similar circuitry being employed in generator 8 as mentioned hereinabove with respect to generator 4. The output spike or narrow pulse from generator 8 is employed to excite a second acoustic means in the form of a SAW interdigital transducer 9 which responds to provide an RF signal therein. The output of transducers 5 and 9 are received by receiving transducers 10 and 11, respectively, which are SAW receiving transducers. The RF outputs of these transducers 10 and 11 are then coupled to a frequency mixer, such as a summing mixer 12, to provide the desired narrowly spaced signal (discrete) frequency signal as the output of the frequency synthesizer of the present invention.

It has been demonstrated in the past that one can fabricate a SAW interdigital transducer with spatially varying periodicity. For the purposes of explanation and as shown in FIG. 1 it will be assumed that the periodicity of transducers 5 and 9 vary linearly with distance along the transducers such that at one end of the transducers the adjacent digits are closely spaced while at the other end of the transducer the adjacent digits are widely spaced with the spacing being linearly varied along the distance of the transducers in between the two ends of the transducer. When an impulse is applied to a SAW transducer such as transducer 5 the wave emerging from the left of transducer 5 has a frequency-time characteristic as illustrated in FIG. 2, while that emerging from the right end of transducer 5 has a frequency-time characteristic as illustrated in FIG. 3. Mathematically, the emerging waves can be expressed as follows:

$$\left.\begin{array}{l}f_{left} = f_- = -at + f_{-o} \\ f_{right} = f_+ = at + f_{+o}\end{array}\right\} \quad o \leq t \leq t_m, \text{ where "a" is}$$

$$\frac{\text{(maximum spacing of digits + minimum spacing of digits)}}{\text{physical length of transducer}}$$

divided by the velocity of the sound wave, $f_o$ is the transducer frequency, t is equal to time and $t_m$ is equal to t maximum.

Consider two identical SAW transducers, such as transducers 5 and 9 deposited on the same substrate with the spacing of the adjacent digits being as illustrated in FIG. 1. When transducer 5 is excited with a train of pulses having a repetition period of $t_m + \Delta t$ which is produced at the output of divider 2 and transducer 9 is excited with the identical train of pulses but delayed an amount $\Delta t$, which is provided at the output of divider 6, the resultant output frequencies versus time are as shown in FIG. 4. Both of the outputs from transducers 5 and 9 are mixed in a summing mixer 12 of a balanced or doubly balanced design. The output frequency of mixer 12 is $$f_+ + f_- = -a\Delta t + f_{+o} + f_{-o}.$$

By varying the delay time such as, for instance, by the variable digital division obtainable with divider 6, the output frequency from mixer 12 may be incrementably changed. The amount of change being determined by the value of "a" for a given time increment. It should be apparent that the pulse train at the output of generator 4 could be applied to a transducer having the spacing of the digits similar to that of transducer 9 and that the delay pulse train at the output of generator 8 could be applied to a transducer having the spacing of the digits similar to that of transducer 5 resulting in an identical output signal from mixer 12.

Two further embodiments of the digits in the transducers 5 and 9 and the end of the transducers to which the two pulse trains are applied are shown in FIGS. 5 and 6. In FIG. 5 the input pulse trains from generators 4 and 8 are coupled to the end of transducers 5 and 9 having the wider spacing between the adjacent digits while in FIG. 6 the two input pulse trains from generators 4 and 8 are applied to that end of transducers 5 and 9 having the closer spacing between adjacent digits thereof. The output from the transducers through the receiving transducers 10 and 11 are coupled to a subtractive mixer 13 in both modifications of FIGS. 5 and 6 and the output frequency from substractive mixer 13 is $$f_-(t) - f_-(t - \Delta t) = a\Delta t,$$

or $$f_+(t) - f_+(t - \Delta t) = a\Delta t.$$

Referring to FIG. 7, there is illustrated therein in block diagram form an acoustic means that may be substituted for each of the SAW transducers 5 and 9 of FIG. 1. The acoustic means of FIG. 7 basically includes a SAW or bulk acoustic delay line 14, a frequency mixer 15 coupled to the output of delay line 14 and the output of a local oscillator 16 have an output frequency $\Delta f$ to obtain a frequency staircase waveform rather than a linear ramp waveform. The output of mixer 15 is amplified in amplifier 17 to compensate for losses in delay line 14 and mixer 15. The output of amplifier 17 is coupled to an input of delay line 14 to provide a pulse recirculating arrangement. When a single pulse, such as an RF pulse or burst of length Td equal to the time delay line 14 of a pulse train having a repetition frequency $f_o$ is injected into delay line 14, the delayed output signal can be upconverted by mixer 15 in the form of a single sideband (SSB) mixer to $f_o + \Delta f$. After amplification in amplifier 17, the upconverted pulse will again be passed through delay line 14 and upconverted to $f_o + Z\Delta f$ in mixer 15. This process will continue indefinitely until the bandwidth of amplifier 17 or delay line 14 or mixer 15 is exceeded. The output signal of the acoustic means of FIG. 7 is at the output of delay line 14 and will be successive bursts or pulses at frequency $f_o + N\Delta f$ as shown in FIG. 8, where N is equal to the number of times the injected pulse has passed through delay line 14. The waveform of FIG. 8 is a waveform having an increase frequency staircase characteristic.

By causing the mixer 15 to perform a down conversion, the resultant output signal of the acoustic means of FIG. 7 will be a waveform having a decreasing frequency staircase characteristic as shown in FIG. 9. Thus, by replacing SAW transducer 5 of FIG. 1 by an acoustic means of FIG. 7 having an increasing frequency staircase characteristic output signal, such as illustrated by generator 18 of FIG. 10, excited by a pulse input and replacing SAW transducer 9 by an acoustic means of FIG. 7 having a decreasing frequency staircase characteristic output signal, such as illustrated by generator 19 of FIG. 10, excited by the pulse input delayed an amount NTd and combining the resultant outputs in a mixer 20, a desired discrete frequency output signal is obtained for the synthesizer as in the embodiment of FIG. 1. By adjusting the delay of the pulse into generator 19 in a manner as described with respect to FIG. 1 the output frequency of the synthesizer becomes adjustable. The output of frequency mixer 20, in the form of a pulse, can be injected into a pulse extender 21 to increase the width of the pulse extender 21 and may be a phase locked loop or a recirculating delay line.

While I have described above the principles of my invention in connection with specific apparatus, it is to be clearly understood that this description is made only by way of example and not as a limitation to the scope of my invention as set forth in the objects thereof and in the accompanying claims.

I claim:

1. A frequency synthesizer to generate a selected, adjustable discrete frequency output signal comprising:
   a pair of acoustic means each providing an output signal having a predetermined frequency versus time characteristic;
   first means coupled to each of said pair of acoustic means to excite one of said pair of acoustic means with pulses having a given repetition frequency and to excite the other of said pair of means by said pulses after being delayed a given variable amount; and second means coupled to each of said pair of acoustic means to provide said selected discrete frequency output signal;

each of said pair of acoustic means including
- a surface acoustic wave interdigital transducer having a predetermined spatially varying periodicity therealong; and said first means including
- a source of timing pulses having a repetition frequency greater than said given repetition frequency,
- a programmable frequency divider to provide said variable delay having its output coupled to said other of said pair of transducers,
- a fixed frequency divider having its input coupled to said source of timing pulses to provide said pulses on its output which is coupled to said one of said pair of transducers, and
- a gate means having an output coupled to an input of said programmable divider, a first input coupled to said source of timing pulses, a second input coupled to said output of said fixed divider to activate said gate means to pass said timing pulses to said programmable divider and a third input coupled to said output of said programmable divider to block passage of said timing pulse when a pulse appears at said output of said programmable divider.

2. A synthesizer according to claim 1, wherein said predetermined frequency versus time characteristic is a linear characteristic.

3. A synthesizer according to claim 1, wherein one of said pair of acoustic means has a linear increasing frequency versus time characteristic and the other of said pair of acoustic means has a linear decreasing frequency versus time characteristic.

4. A synthesizer according to claim 1, wherein said predetermined frequency versus time characteristic is a staircase characteristic.

5. A synthesizer according to claim 1, wherein one of said pair of acoustic means has an increasing staircase frequency versus time characteristic and the other of said pair of acoustic means has a decreasing staircase frequency versus time characteristic.

6. A synthesizer according to claim 1, wherein said predetermined periodicity varies linearly with distance along each of said pair of transducers.

7. A synthesizer according to claim 1, wherein said first means further includes
- a first narrow pulse generator coupled between said output of said programmable divider and said other of said pair of transducers, and
- a second narrow pulse generator coupled between said output of said fixed divider and said one of said pair of transducers.

8. A synthesizer according to claims 1, 6 or 7, wherein
each of said pair of transducers have adjacent digits closely spaced at one end thereof and widely spaced at the other end thereof;
said pulses are coupled to said one end of said one of said pair of transducers;
said delayed pulses are coupled to said other end of said other of said pair of transducers; and
said second means is coupled to said other end of said one of said pair of transducers and to said one end of said other of said pair of transducers.

9. A synthesizer according to claim 8, wherein said second means includes
a summing frequency mixer.

10. A synthesizer according to claims 1, 6 or 7, wherein
each of said pair of transducers have adjacent digits closely spaced at one end thereof and widely spaced at the other end thereof,
said pulses are coupled to said other end of said one of said pair of transducers,
said delayed pulses are coupled to said one end of said other of said pair of transducers, and
said second means is coupled to said one end of said one of said pair of transducers and to said other end of said other of said pair of transducers.

11. A synthesizer according to claim 10, wherein said second means includes
a summing frequency mixer.

12. A synthesizer according to claims 1, 6 or 7, wherein
each of said pair of transducers have adjacent digits closely spaced at one end thereof and widely spaced at the other end thereof,
said pulses are coupled to said other end of said one of said pair of transducers,
said delayed pulses are coupled to said other end of said other of said pair of transducers, and
said second means is coupled to said one end of said one of said pair of transducers and to said one end of said other of said pair of transducers.

13. A synthesizer according to claim 12, wherein said second means includes
a subtractive frequency mixer.

14. A synthesizer according to claims 1, 6 or 7, wherein
each of said pair of transducers have adjacent digits closely spaced at one end thereof and widely spaced at the other end thereof,
said pulses are coupled to said one end of said one of said pair of transducers,
said delayed pulses are coupled to said one end of said other of said pair of transducers, and
said second means is coupled to said other end of said one of said pair of transducers and said other end of said other of said pair of transducers.

15. A synthesizer according to claim 14, wherein said second means includes
a subtractive frequency mixer.

16. A synthesizer according to claims 1, 6 or 7, wherein
said second means includes
a frequency mixer.

17. A frequency synthesizer to generate a selected, adjustable discrete frequency output signal comprising:
a pair of acoustic means each providing an output signal having a predetermined frequency versus time characteristic;
first means coupled to each of said pair of acoustic means to excite one of said pair of acoustic means with pulses having a given repetition frequency and to excite the other of said pair of means by said pulses after being delayed a given variable amount; and
second means coupled to each of said pair of acoustic means to provide said selected discrete frequency output signal;
said first means including a source of timing pulses having a repetition frequency greater than said given repetition frequency, a programmable frequency divider to provide said variable delay having its output coupled to said other of said pair of transducers, a fixed frequency divider having its input coupled to said source of timing pulses to provide said pulses on its output which is coupled to said one of said pair of transducers, and a gate means having an output coupled to an input of said programmable divider, a first input coupled to said source of timing pulses, a second input coupled to said output of said fixed divider to activate said gate means to pass said timing pulses to said programmable divider and a third input coupled to said output of said programmable divider to block passage of said timing pulse when a pulse appears at said output of said programmable divider.

18. A synthesizer according to claim 17, wherein said first means further includes a first narrow pulse generator coupled between said output of said programmable divider and said other of said pair of acoustic means, and a second narrow pulse generator coupled between said output of said fixed divider and said one of said pair of acoustic means.

19. A synthesizer according to claims 1, 17 or 18, wherein each of said pair of acoustic means includes
an acoustic delay line having a predetermined time delay related to the width of each of said pulses, said delay line having an output providing said output signal having said predetermined frequency versus time characteristic in the form of a staircase characteristic and a first input to receive said pulses, an oscillator having a predetermined incremental frequency, and a first frequency mixer having a first input coupled to said output of said delay line, a second input coupled to the output of said oscillator and an output coupled to a second input of said delay line.

20. A synthesizer according to claim 19, wherein each of said pair of acoustic means includes an amplifier coupled between said output of said first mixer and said second input of said delay line.

21. A synthesizer according to claim 20, wherein said first mixer of said one of said pair of acoustic means is an upconverting mixer to provide said output signal of said delay line with an increasing staircase characteristic, and said first mixer of said other of said pair of acoustic means in a down converting mixer to provide said output signal of said delay line with a decreasing staircase characteristic.

22. A synthesizer according to claim 21, wherein said second means includes a second frequency mixer coupled to said output of each of said delay lines to provide output pulses having said selected discrete frequency output signal.

23. A synthesizer according to claim 22, further including a pulse extender coupled to the output of said second mixer to increase the width of said output pulses at the output of said second mixer.

* * * * *